(12) United States Patent
Lee et al.

(10) Patent No.: US 7,714,656 B2
(45) Date of Patent: May 11, 2010

(54) OPERATIONAL AMPLIFIER

(75) Inventors: Hyunjoong Lee, Seoul (KR); Young Sik Kim, Seoul (KR); Suhwan Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 22 days.

(21) Appl. No.: 12/053,406

(22) Filed: Mar. 21, 2008

(65) Prior Publication Data

US 2008/0231365 A1    Sep. 25, 2008

(30) Foreign Application Priority Data

Mar. 21, 2007    (KR) ............... 10-2007-0027641

(51) Int. Cl.
*H03F 3/45*    (2006.01)

(52) U.S. Cl. .................... 330/258; 330/259

(58) Field of Classification Search .......... 330/258–260
See application file for complete search history.

(56) References Cited

U.S. PATENT DOCUMENTS 5,166,635 A * 11/1992 Shih .................. 330/258

* cited by examiner

*Primary Examiner*—Khanh V Nguyen
(74) *Attorney, Agent, or Firm*—Birch, Stewart, Kolasch & Birch, LLP

(57) ABSTRACT

An operational amplifier including an input amplifier configured to amplify at least one differential input signal, a first common mode feedback amplifier configured to amplify a first common mode voltage, a cascode amplifier configured to cascode-amplify output signals from the input amplifier and the first common mode feedback amplifier, a first common mode voltage generator configured to generate a central voltage of the output signal from the cascode amplifier and input the central voltage to the first common mode feedback amplifier, and a frequency compensator configured to feedback the output signal of the cascode amplifier to the first common mode feedback amplifier so as to compensate a frequency of the first common mode feedback amplifier.

10 Claims, 3 Drawing Sheets

OPERATIONAL AMPLIFIER

CROSS-REFERENCE TO A RELATED APPLICATION

The present application claims priority to Korean Application Number 10-2007-0027641 filed on Mar. 21, 2007, the disclosure of which is incorporated herein by reference in its entirety.

BACKGROUND OF THE INVENTION

1. Field of the Invention

The present invention relates to an operational amplifier that can be used as a charge amplifier, and more particularly to a differential operational amplifier capable of differentially outputting a differential input signal by differentially amplifying the differential input signal to a broader bandwidth.

2. Discussion of the Related Art

When constructing probe-based data storage utilizing a piezoelectric sensor manufactured through MEMS (Micro Electro Mechanical System) design techniques, a miniscule intensity of charge outputted from the piezoelectric sensor may be amplified to a sufficient amount of voltage using a charge amplifier.

Typically, an operational amplifier is largely used for the charge amplifier. In order to align a plurality of piezoelectric cantilevers manufactured by the MEMS design techniques with multiple charge amplifiers, and integrate the same, a low power and high density circuit design technique is required.

An operational amplifier used as a charge amplifier must amplify a small sized input signal to a high gain and show an excellent characteristic relative to various noises. Therefore, the operational amplifier used as the charge amplifier must be preferably constructed in a differential structure to minimize the influence of noise.

A common mode feedback circuit must be essentially disposed in the operational amplifier in order to stabilize an output signal of the operational amplifier. Moreover, in order to design an operational amplifier capable of detecting a continuously-timed signal, not a discretely-timed signal, a continuously-timed common mode feedback circuit must be disposed. At the same time, a signal frequency amplified by the operational amplifier must be compensated to obtain a sufficiently enough phase margin and to secure circuit stability.

A typical Miller compensation is widely used as one of the methods for compensating the frequency of the operational amplifier. However, when a differential-type operational amplifier employed for the Miller compensation is utilized for use that requires a relatively high closed circuit amplification rate as in the charge amplifier, a frequency response bandwidth relative to allowable consumption power comes to be degraded to make it difficult to operate at a high speed. It is therefore essential to require a frequency compensation method capable of expanding a bandwidth that does not consume an additional power.

SUMMARY OF THE INVENTION

An object of this disclosure is to provide a differential-type operational amplifier capable of enhancing a bandwidth that does not consume an additional power and minimizing a layout area. Another object is to provide an operational amplifier capable of enhancing stability of a common mode feedback circuit disposed in a differential-type operational amplifier.

According to the operational amplifier having the above-mentioned object, frequency compensation is performed based on a negative feedback factor to reduce a capacitance of a capacity that performs frequency compensation in the differential-type operational amplifier and expand the bandwidth.

As the frequency compensation is performed based on the negative feedback factor by the operational amplifier, a phase margin of the common mode feedback circuit is not sufficient, such that a separate frequency compensation is performed using a capacitor having a very small capacitance only at a portion of the common mode feedback circuit using the Miller compensation effect.

The operational amplifier uses a capacitor having a very small capacitance to enable a minimization of a layout area and to dispense with an additional power consumption as no active elements are added except for addition of capacitor and size change for frequency compensation.

In a general aspect, an operational amplifier includes an input amplifier amplifying a differential input signal; a first common mode feedback amplifier amplifying a first common mode voltage; a cascode amplifier cascode-amplifying output signals from the input amplifier and the first common mode feedback amplifier; a first common mode voltage generator generating a central voltage of the output signal from the cascode amplifier and inputting the central voltage to the first common mode feedback amplifier; and a frequency compensator feedbacking the output signal of the cascode amplifier to the first common mode feedback amplifier to compensate the frequency.

Implementations of this aspect may include one or more of the following features.

The first common mode feedback amplifier and the cascode amplifier are folded cascode amplifiers.

The frequency compensator is a capacitor feedbacking the output signal from the cascode amplifier to the first common mode feedback amplifier.

The operational amplifier may further comprise: an output amplifier generating a differential output signal by amplifying the output signal from the cascode amplifier; a second common mode voltage generator generating a second common mode voltage using the central voltage of the differential output signal outputted by the output amplifier; and a second common mode feedback amplifier amplifying the second common mode voltage generated by the second common mode voltage generator and feedbacking the amplified second common mode voltage to the output amplifier.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE INVENTION

The following detailed description of the present disclosure is in reference to accompanying drawings, which are incorporated herein and form part of the specification, illustrate implementations of the present disclosure and, together with the description, further serve to explain the principles of the novel concept and to enable a person skilled in the pertinent art(s) to make and use the concept. The description is of illustrative examples of various implementations in which the concept may be practiced. The concept is not limited to the specific illustrative examples. Other configurations and arrangements embodying or practicing the present disclosure can be readily implemented by persons skilled in the arts, upon reading this description.

Figure 1:
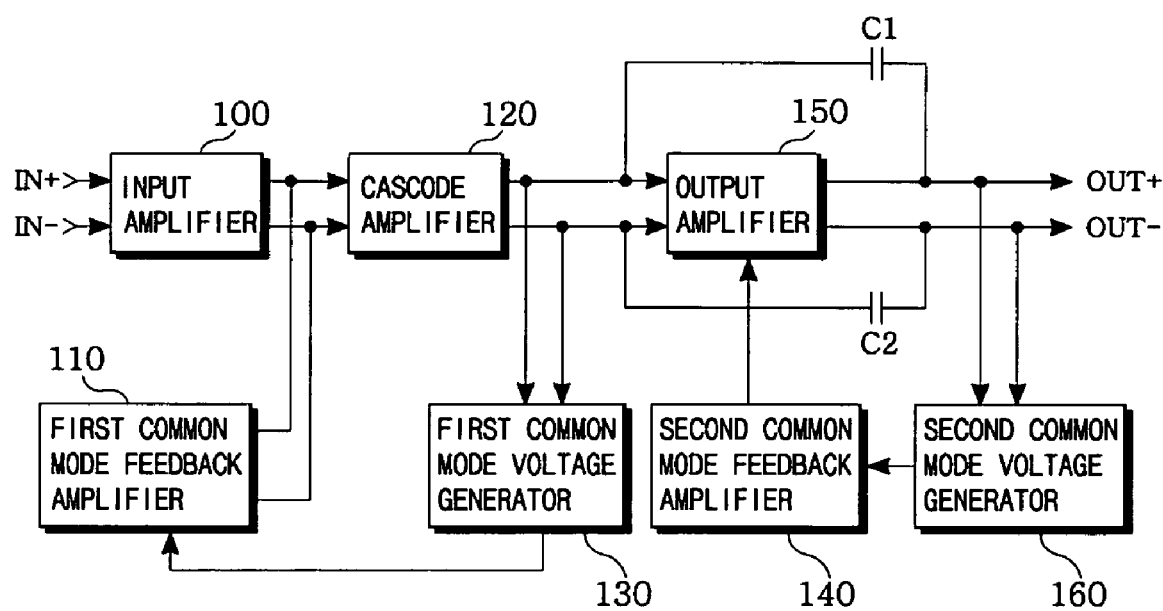
FIG. 1 is a schematic block diagram illustrating an operational amplifier according to an embodiment of the present invention.

FIG. 1 is a schematic block diagram illustrating construction of an operational amplifier, wherein reference numeral 100 defines an input amplifier. The input amplifier (100) may serve to differentially amplify differential input signals (IN+) (IN−) that are inputted.

Reference numeral 110 is a first common mode feedback amplifier. The first common mode feedback amplifier (110) may serve to amplify a first common mode voltage that is feedback. The differential input signals (IN+) (IN−) amplified by the input amplifier (100) and the first common mode voltage amplified by the first common mode feedback amplifier (110) may be concurrently inputted into a cascode amplifier (120) and amplified.

An output signal of the cascode amplifier (120) may be inputted into a first common mode voltage generator (130), where a central voltage is used to generate a first common mode voltage and the generated first common mode voltage may be amplified by the first common mode feedback amplifier (110) to be feedback to the cascode amplifier (120). The output signal of the cascode amplifier (120) may be inputted into an output amplifier (150).

Reference numeral 140 is a second common mode feedback amplifier. The second common mode feedback amplifier (140) may amplify a second common mode voltage that is feedback, and the amplified second common mode voltage may be inputted to the output amplifier (150).

The output amplifier (150) may amplify the output signal of the cascode amplifier (120) responsive to the second common mode voltage inputted from the second common mode feedback amplifier (140) to output differential output signals (OUT+) (OUT−).

The differential output signals (OUT+) (OUT−) may be inputted into a second common mode voltage generator (160), where a central voltage is generated by the second common mode voltage, and the generated second common mode voltage may be amplified by the second common mode feedback amplifier (140) to be feedback to the output amplifier (150). Furthermore, the differential output signals (OUT+) (OUT−) may be feedback to an input terminal of the output amplifier (150) via capacitors (C1, C2), whereby frequencies are compensated.

In a frequency band where an open circuit gain is zero decibel (dB) in the generalized operational amplifier, frequency must be compensated to have a sufficient phase margin. To this end, the capacitors (C1, C2) must have a fairly large capacitance. The frequency-compensated operational amplifier is made to operate with a stable phase margin relative to any configurations of closed circuits.

However, when the foregoing generalized operational amplifier is used for the charge amplifier that requires a relatively high closed circuit gain, an inferior frequency response bandwidth may be shown relative to the given power consumption because of frequency compensation overly realized relative to usage of the charge amplifier.

Consequently, in case the operational amplifier of FIG. 1 is used as a charge amplifier, the frequency compensation may be made in order to have a sufficient phase margin at a frequency that equals an absolute value of a value shown in decibel (dB) for a negative feedback factor of a circuit given with an open circuit gain of the operational amplifier. In so doing, a much improved frequency response characteristic relative to same power consumption may be possessed, and layout area that is wasted by capacitance may be minimized.

Meanwhile, the operational amplifier of FIG. 1 may operate in such a manner that the first common mode voltage feedback to the cascode amplifier (120) by being amplified by the first common mode feedback amplifier (110) shares the same portion as that of a path for amplifying the differential input signals (IN+) (IN−), whereby the same frequency compensation is realized.

As a result, in case the frequency compensation is performed based on a negative feedback factor of a value that is smaller than 1 according to usage of path for amplifying the differential input signals (IN+) (IN−) to adequately reduce or remove the capacitance of the capacitors (C1, C2), the phase margin may be insufficient to make the operation instable because the first common mode feedback amplifier (110) has a negative feedback factor that is different from that of the path of the differential input signals (IN+) (IN−).

Figure 2:
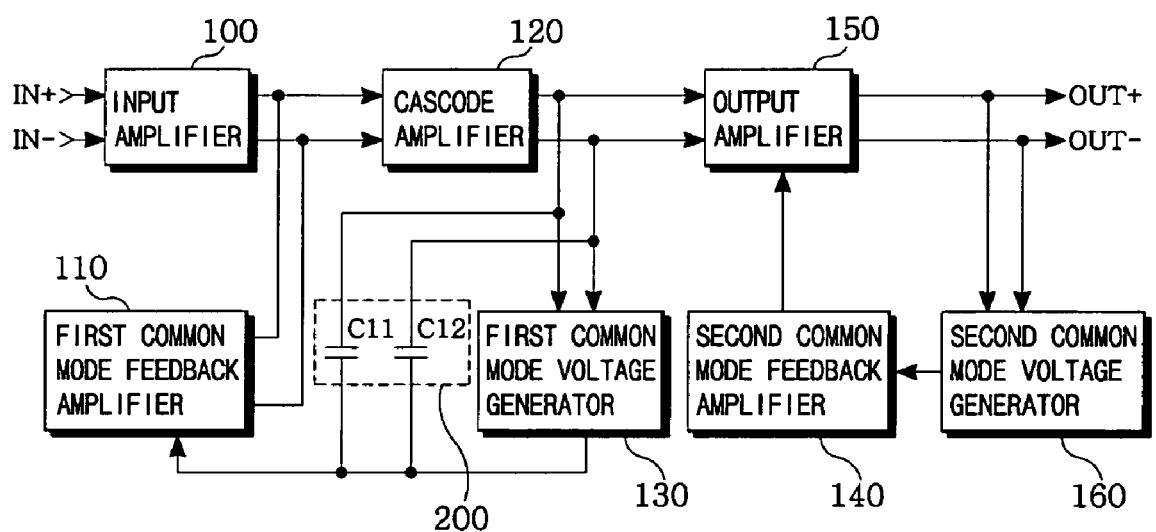
FIG. 2 is a schematic block diagram illustrating an operational amplifier according to another embodiment of the present invention.

FIG. 2 is a schematic block diagram illustrating construction of an operational amplifier according to the present novel concept. Referring to FIG. 2, the operational amplifier may not be disposed with frequency compensating capacitors (C1, C2) between an input terminal and an output terminal of the output amplifier (150), but disposed with a frequency compensator (200) between an output terminal of the cascode amplifier (120) and an input terminal of the common mode amplifier (110). The frequency compensator (200) may be disposed with capacitors (C11, C12) between the output terminal of the cascode amplifier (120) and the input terminal of the common mode amplifier (110).

Figure 3:
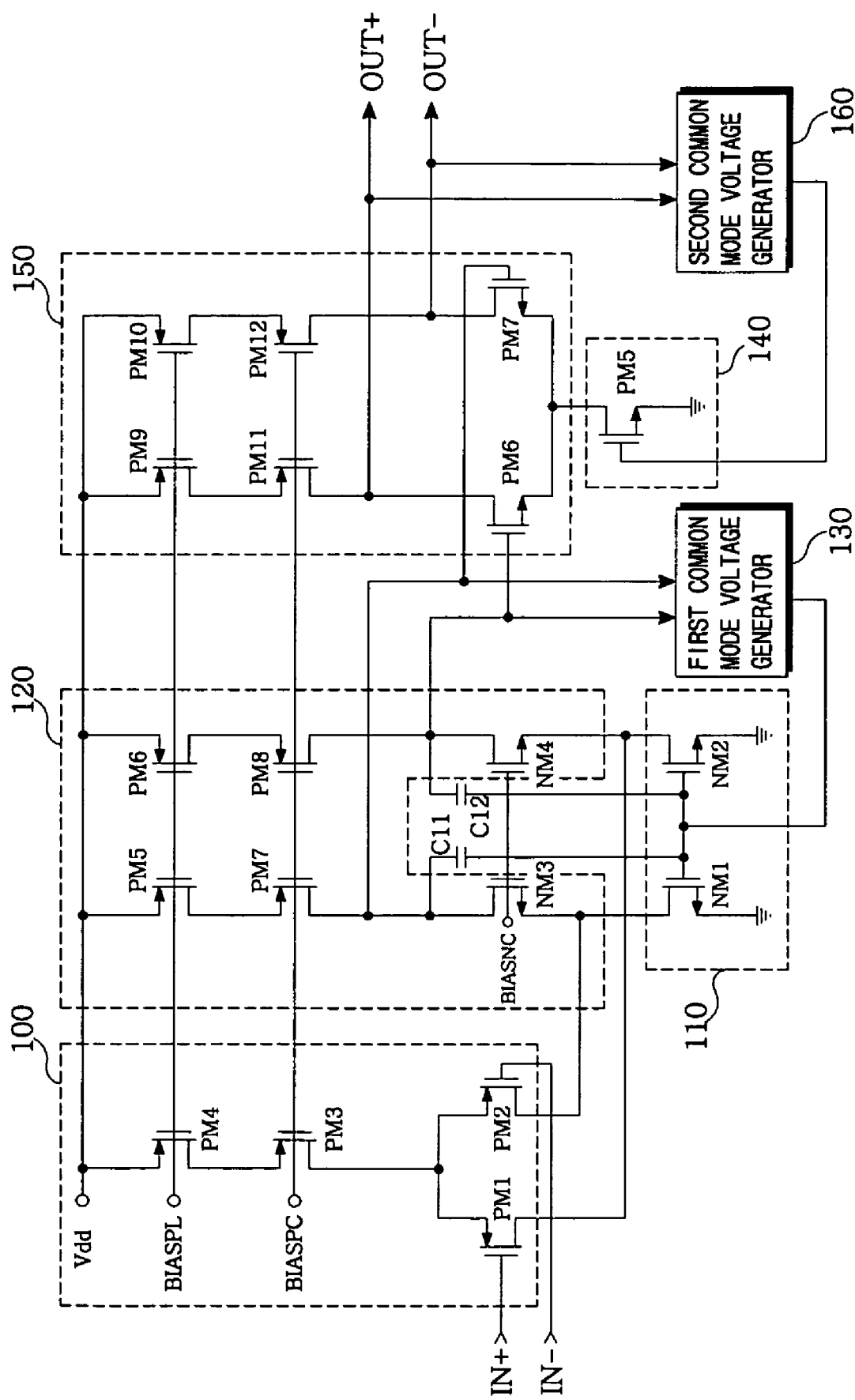
FIG. 3 is a detailed circuit diagram illustrating an operational amplifier according to an embodiment of the present invention.

FIG. 3 is a detailed circuit diagram illustrating construction of an exemplary implementation of an operational amplifier according to the instant novel concept. Referring to FIG. 3, the input amplifier (100) may be configured in such a way that input terminals into which differential input signals (IN+) (IN−) are inputted are respectively connected to gates of P-channel Metal Oxide Semiconductor (p-MOS) transistors (PM1, PM2). p-MOS transistors (PM3, PM4) are connected in series between contact points of sources of the p-MOS transistors (PM1, PM2) and the power terminal (Vdd). Gates of the p-MOS transistors (PM3, PM4) are respectively connected with bias voltage terminals (BIASPL, BIASPC) to allow the amplified differential input signals (IN+) (IN−) amplified by the drains of the p-MOS transistors (PM1, PM2) to be outputted.

The first common mode feedback amplifier (110) may be configured in such a fashion that an output terminal of the first common mode voltage generator (130) is connected to a gate of the N-channel Metal Oxide Semiconductor (n-MOS) transistors (NM1, NM2). Sources of the n-MOS transistors (NM1, NM2) may be grounded to allow the first common mode feedback voltage to be outputted to drains of the n-MOS transistors (NM1, NM2).

The cascode amplifier (120) may be configured in such a way that drains of p-MOS transistors (PM3, PM4) of the input amplifier (100) and drains of n-MOS (NM1, NM2) of the common mode feedback amplifier (110) are connected to sources of the n-MOS transistors (NM3, NM4). Gates of the n-MOS transistors (NM3, NM4) are connected to the bias voltage terminal (BIASNC).

Furthermore, p-MOS transistors (PM5, PM7) may be connected in series between the power terminal (Vdd) and the drain of n-MOS transistor (NM3), and p-MOS transistors (PM6, PM8) may be connected in series between the power terminal (Vdd) and drain of the n-MOS transistor (NM4). Gates of the p-MOS transistors (PM5, PM6) may be connected to the bias voltage terminal (BIASPL), and gates of the p-MOS transistors (PM7, PM8) may be connected to the bias voltage terminal (BIASPC). Amplified signals may be outputted from a contact point between the drain of the n-MOS transistor (NM3) and the drain of the p-MOS transistor (PM7) and a contact point between the drain of the n-MOS transistor (NM4) and the drain of the p-MOS transistor (PM8).

The first common mode feedback amplifier (110) and the cascode amplifier (120) may thus constitute a folded cascode amplifier. The capacitors (C11, C12) may be connected between gates of the N-MOS transistors (NM1, NM2) and the drains of the n-MOS transistors (NM3, NM4) to form the frequency compensator (200).

The second common mode feedback amplifier (140) may be configured in such a way that an output terminal of the second common mode voltage generator (160) is connected to a gate of the n-MOS transistor (NM5), where a source of the n-MOS transistor (NM5) is grounded to allow the amplified second common mode voltage to be outputted to a drain of the n-MOS transistor (NM5).

The output amplifier (150) may be configured in such a manner that contact points of drains between the n-MOS transistors (NM3, NM4) and the p-MOS transistors (PM7, PM8) are respectively connected to gates of the n-MOS transistors (NM6, NM7), where sources of the n-MOS transistors (NM6, NM7) may be connected to a drain of the N-MOS transistor (NM5). Furthermore, between the power terminal (Vdd) and drains of the n-MOS transistors (NM6, NM7), gates of p-MOS transistors (PM9, PM10) connected to the bias voltage terminal (BIASPL) and gates of p-MOS transistors (PM11, PM12) connected to the bias voltage terminal (BIASPC) may be connected in series to allow the differential output signals (OUT+) (OUT−) amplified from contact points of drains of the n-MOS transistors (NM6, NM7) and the drains of the p-MOS transistors (PM11, PM12) to be respectively outputted.

The operational amplifier thus configured may be operated in such a fashion that an operational voltage is applied to the power terminal (Vdd), and bias voltages are respectively applied to the bias voltage terminals (BIASPL, BIASPC, BIASNC), where the differential input signals (IN+) (IN−) may be inputted to the gates of the p-MOS transistors (PM1, PM2) of the input amplifier (100) and amplified thereat. The amplified differential input signals (IN+) (IN−) may be outputted to the drains of the p-MOS transistors (PM1, PM2) and inputted to the cascode amplifier (120).

Furthermore, the output signal of the cascode amplifier (120) may be inputted to the first common mode voltage generator (130), where the first common mode voltage generator (130) may generate the central voltage of the output signal from the cascode amplifier (120) as the first common mode voltage. The generated first common mode voltage may be amplified by the n-MOS transistors (NM1, NM2) of the first common mode feedback amplifier (110) to be inputted to the cascode amplifier (120).

The cascode amplifier (120) may amplify the amplified differential input signals (IN+) (IN−) inputted from the input amplifier (100) and the first common mode voltage amplified by the first common mode feedback amplifier (110) and outputs same.

The output signal of the cascode amplifier (120) may be feedback to the first common mode feedback amplifier (110) via capacitors (C11, C12) of the frequency compensator (200). The output signal of the cascode amplifier (120) may be inputted to the first common code voltage generator (130) to generate a central voltage as the first common mode voltage. The output signal of the cascode amplifier (120) may be inputted to the gates of the n-MOS transistors (NM6, NM7).

The output signal of the output amplifier (150) may be inputted to the second common mode voltage generator (160) to generate a central voltage as the second common mode voltage. The generated second common mode voltage may be amplified by the n-MOS transistor (NM5) of the second common mode feedback amplifier (140) to be inputted to sources of the n-MOS transistors (NM6, NM7) of the output amplifier (150).

Successively, the n-MOS transistors (NM6, NM7) of the output amplifier (150) may amplify the signal inputted from the cascode amplifier (120) in response to the second common mode voltage outputted by the second common mode feedback amplifier (140) to output the differential output signals (OUT+) (OUT−). The outputted differential output signals (OUT+) (OUT−) are inputted to the second common mode voltage generator (160) to generate a central voltage as a second common mode voltage.

The operational amplifier thus configured may not have any influence on the frequency compensation of the differential input signals (IN+) (IN−) and perform the frequency compensation of the first common mode voltage only in a separate manner.

In other words, the signal outputted from the cascode amplifier (120) may be feedback to the first common mode feedback amplifier (110) via the capacitors (C11, C12) of the frequency compensator (200). In doing so, even if the capacitors (C11, C12) having a small value of capacitance are used, the input of the first common mode feedback amplifier (110) may show a fairly large capacitance by the Miller effect, and yet need only an additional capacity of a very small value in the output of the cascode amplifier (120).

As a result, only the first common mode voltage that is feedback to the frequency-compensating capacitors (C11, C12) having a very small capacitance may be frequency-compensated.

As noted above, the novel concept of the present invention can frequency-compensate only the first common mode voltage regardless of the differential input signals to enhance the bandwidth of the operational amplifier. The present concept therefore needs no additional power for consumption and a capacitor of a small capacitance can be employed as a charge amplifier. The concept enables a circuit design calling for a low power and high density even in various applications that require a high speed operation and a high gain at the same time. Furthermore, the present disclosure can reduce the layout area in response to the usage of capacitors having a small capacitance.

The above disclosed subject matter is to be considered illustrative and not restrictive, and the appended claims are intended to cover all such modifications, enhancements, and other implementations, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An operational amplifier comprising:
   an input amplifier configured to amplify at least one differential input signal;
   a first common mode feedback amplifier configured to amplify a first common mode voltage;
   a cascode amplifier configured to cascade-amplify output signals from the input amplifier and the first common mode feedback amplifier;
   a first common mode voltage generator configured to generate a central voltage of the output signal from the cascade amplifier and input the central voltage to the first common mode feedback amplifier;
   a frequency compensator configured to feedback the output signal of the cascode amplifier to the first common mode feedback amplifier so as to compensate a frequency of the first common mode feedback amplifier;
   an output amplifier configured to generate a differential output signal by amplifying the output signal of the cascade amplifier;
   a second common mode voltage generator configured to generate a second common mode voltage using a central voltage of the differential output signal output by the output amplifier; and
   a second common mode feedback amplifier configured to amplify the second common mode voltage generated by the second common mode voltage generator and to feedback the amplified second common mode voltage to the output amplifier.

2. The operational amplifier as claimed in claim 1, wherein the first common mode feedback amplifier and the cascade amplifier are folded cascode amplifiers.

3. The operational amplifier as claimed in claim 1, wherein the frequency compensator is at least one capacitor configured to feedback the output signal from the cascode amplifier to the first common mode feedback amplifier.

4. The operational amplifier as claimed in claim 1, wherein the at least one differential input signal comprises two differential input signals, and
   wherein the input amplifier includes:
   input terminals into which the two differential input signals are input;
   P-channel Metal Oxide Semiconductor (p-MOS) transistors PM1 and PM2, the input terminals being respectively connected to gates of the PM1 and PM2 transistors;
   p-MOS transistors PM3 and PM4 connected in series between contact points of sources of the PM1 and PM2 transistors and a power terminal (Vdd) of the input amplifier; and
   bias voltage terminals BIASPL and BIASPC to allow amplified differential input signals amplified by drains of the PM1 and PM2 transistors to be outputted, gates of the PM3 and PM4 transistors being respectively connected with the terminals BIASPL and BIASPC.

5. The operational amplifier as claimed in claim 4, wherein the first common mode feedback amplifier includes:
   N-channel Metal Oxide Semiconductor (n-MOS) transistors NM1 and NM2 having their gates connected to an output terminal of the first common mode voltage generator and their sources grounded to allow the first common mode voltage to be output to drains of the NM1 and NM2 transistors.

6. The operational amplifier as claimed in claim 5, wherein the cascode amplifier includes n-MOS transistors NM3 and NM4 having their sources connected to drains of the PM1 and PM2 transistors of the input amplifier and drains of the NM1 amd NM2 transistors of the common mode feedback amplifier, and
   wherein gates of the NM3 and NM4 transistors are connected to a bias voltage terminal (BIASNC).

7. The operational amplifier as claimed in claim 6, wherein the cascode amplifier further includes p-MOS transistors PM5 and PM7 connected in series between the power terminal (Vdd) and a drain of NM3 transistor, and p-MOS transistors PM6 and PM8 connected in series between the power terminal (Vdd) and a drain of the NM4 transistor, and
   wherein gates of the PM5 and PM6 transistors are connected to the bias voltage terminal BIASPL, and gates of the PM7 and PM8 transistors are connected to the bias voltage terminal BIASPC, and amplified signals are output from a contact point between the drain of the NM3 transistor and the drain of the PM7 transistor and a contact point between the drain of the NM4 transistor and a drain of the PM8 transistor.

8. The operational amplifier as claimed in claim 7, wherein the frequency compensator includes capacitors C11 and C12 connected between the gates of the NM1 and NM2 transistors and the drains of the NM3 and NM4 transistors.

9. The operational amplifier as claimed in claim 8, wherein the second common mode feedback amplifier includes an n-MOS transistor NM5 having a gate connected to an output terminal of the second common mode voltage generator, and where a source of the NM5 transistor is grounded to allow an amplified second common mode voltage to be output to a drain of the NM5 transistor.

10. The operational amplifier as claimed in claim 9, wherein the output amplifier is arranged such that contact points of the drains between the NM3 and NM4 transistors and the PM7 and PM8 transistors are respectively connected to gates of NM6 and NM7 transistors included in the output amplifier, where sources of the NM6 and NM7 transistors are connected to the drain of the NM5 transistor, and between the power terminal (Vdd) and drains of the NM6 and NM7 transistors, gates of p-MOS transistors PM9 and PM10 included in the output amplifier are connected to the bias voltage terminal (BIASPL) and gates of p-MOS transistors PM11 and PM12 included in the output amplifier are connected to the bias voltage terminal (BJASPC) and connected in series to allow differential output signals amplified from contact points of the drains of the NM6 and NM7 transistors and the drains of the PM11 and PM12 transistors to be respectively outputted.

* * * * *